United States Patent
Pramod et al.

(10) Patent No.: US 9,966,890 B2
(45) Date of Patent: May 8, 2018

(54) DETECTION OF OFFSET ERRORS IN PHASE CURRENT MEASUREMENT FOR MOTOR CONTROL SYSTEM

(71) Applicant: STEERING SOLUTIONS IP HOLDING CORPORATION, Saginaw, MI (US)

(72) Inventors: Prerit Pramod, Saginaw, MI (US); Siddharth Ballal, Saginaw, MI (US); Julie A. Kleinau, Bay City, MI (US)

(73) Assignee: STEERING SOLUTIONS IP HOLDING CORPORATION, Saginaw, MI (US)

( * ) Notice: Subject to any disclaimer, the term of this patent is extended or adjusted under 35 U.S.C. 154(b) by 0 days. days.

(21) Appl. No.: 15/379,990

(22) Filed: Dec. 15, 2016

(65) Prior Publication Data

US 2017/0237375 A1 Aug. 17, 2017

Related U.S. Application Data

(63) Continuation-in-part of application No. 15/044,790, filed on Feb. 16, 2016.

(51) Int. Cl.
| | |
|---|---|
| *H02P 21/22* | (2016.01) |
| *G01R 31/34* | (2006.01) |
| *H02P 27/08* | (2006.01) |
| *H02P 6/28* | (2016.01) |
| *H02P 6/10* | (2006.01) |

(52) U.S. Cl.
CPC ............. *H02P 21/22* (2016.02); *G01R 31/34* (2013.01); *H02P 6/10* (2013.01); *H02P 6/28* (2016.02); *H02P 27/08* (2013.01)

(58) Field of Classification Search
CPC ..... B62D 5/0481; B62D 5/0463; H02P 27/08; H02P 21/22; H02P 6/28; H02P 6/10; G01R 31/34
See application file for complete search history.

(56) References Cited

U.S. PATENT DOCUMENTS

| | | | | |
|---|---|---|---|---|
| 5,504,403 A | * | 4/1996 | McLaughlin | B62D 6/10 180/446 |
| 6,046,560 A | * | 4/2000 | Lu | B62D 5/0463 180/443 |
| 6,107,767 A | * | 8/2000 | Lu | B62D 5/046 318/432 |
| 6,152,254 A | * | 11/2000 | Phillips | B62D 5/0463 180/421 |
| 6,370,459 B1 | * | 4/2002 | Phillips | B62D 5/0436 180/443 |

(Continued)

*Primary Examiner* — Jerrah Edwards
*Assistant Examiner* — Majdi Alsomiri
(74) *Attorney, Agent, or Firm* — Cantor Colburn LLP

(57) ABSTRACT

A system for detecting offset error in a power steering system is provided. The system includes a programmable high pass filter module configured to filter a final voltage command and generate a filtered final voltage command. The filtered final voltage command includes the sinusoidal component, a gain and phase compensation module configured to perform a gain compensation and a phase compensation on the filtered final voltage command to generate a compensated final voltage command. An error detection module is configured to determine an offset of the compensated final voltage command in a stator reference frame.

19 Claims, 12 Drawing Sheets

(56) References Cited

U.S. PATENT DOCUMENTS

| | | | | |
|---|---|---|---|---|
| 6,422,335 | B1* | 7/2002 | Miller | B62D 5/0463 180/446 |
| 6,498,451 | B1* | 12/2002 | Boules | B62D 5/0403 318/400.06 |
| 7,161,323 | B2* | 1/2007 | Ajima | B62D 5/046 318/560 |
| 7,423,397 | B2* | 9/2008 | Katahira | B62D 5/049 318/432 |
| 8,427,084 | B2* | 4/2013 | Kobayashi | H02M 7/53873 318/255 |
| 2003/0024759 | A1* | 2/2003 | Williams | B62D 5/0463 180/443 |
| 2004/0031641 | A1* | 2/2004 | McLaughlin | B62D 5/0463 180/446 |
| 2005/0125124 | A1* | 6/2005 | Nagase | B62D 5/046 701/41 |
| 2005/0251311 | A1* | 11/2005 | Burton | B62D 5/0463 701/41 |
| 2009/0192679 | A1* | 7/2009 | Kobayashi | B62D 5/0463 701/42 |
| 2010/0004824 | A1* | 1/2010 | Ikeda | B62D 5/0463 701/42 |
| 2010/0198461 | A1* | 8/2010 | Burton | B62D 5/0463 701/41 |
| 2010/0217487 | A1* | 8/2010 | Murakami | B62D 5/0472 701/42 |
| 2011/0054740 | A1* | 3/2011 | Kurishige | B62D 5/0472 701/42 |
| 2012/0197493 | A1* | 8/2012 | Fujimoto | B62D 15/024 701/41 |
| 2012/0290174 | A1* | 11/2012 | Murakami | B62D 5/0472 701/41 |
| 2012/0290176 | A1* | 11/2012 | Murakami | B62D 5/0472 701/42 |
| 2013/0238193 | A1* | 9/2013 | Bolourchi | B62D 5/0466 701/42 |
| 2014/0046548 | A1* | 2/2014 | Mukai | B62D 6/00 701/42 |
| 2014/0058630 | A1* | 2/2014 | Kezobo | B62D 5/0463 701/42 |
| 2014/0088835 | A1* | 3/2014 | Sworn | B62D 5/0466 701/42 |
| 2015/0066299 | A1* | 3/2015 | Jang | B62D 5/0463 701/41 |

* cited by examiner

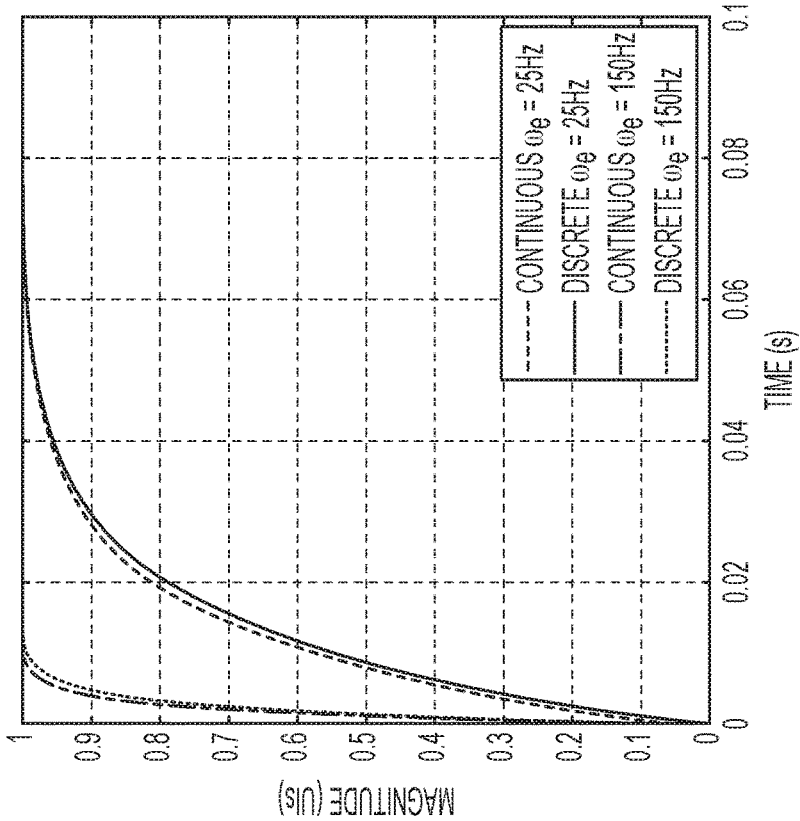
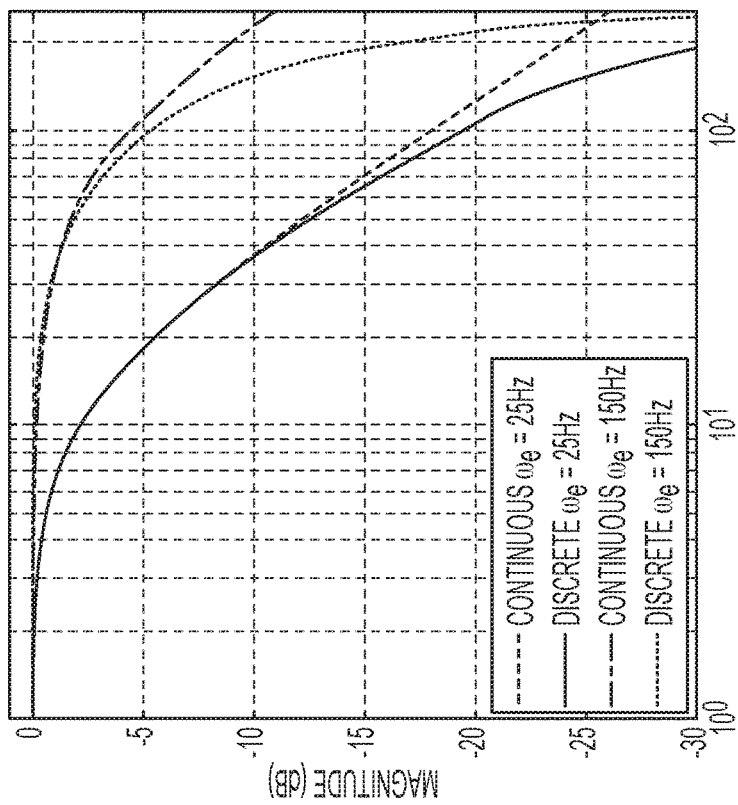
FIG. 7

DETECTION OF OFFSET ERRORS IN PHASE CURRENT MEASUREMENT FOR MOTOR CONTROL SYSTEM

BACKGROUND

Electric Power Steering (EPS) systems require the electric motor used to provide steering assist to be operated using a method of torque control. When using a Permanent Magnet Synchronous Machine (PMSM), Field Oriented Control (FOC) may be utilized. FOC transforms the AC phase motor voltage and current signals in the stationary reference frame to the synchronously rotating reference frame, commonly referred to as the d/q axis reference frame, in which the motor voltages and currents become direct current (DC) quantities. FOC torque control is commonly implemented through a closed loop current control method that employs current regulators to minimize the error between commanded and measured currents to achieve perfect current tracking. Thus, current control requires the motor currents to be measured, which may be achieved by measuring the phase currents of the electric machine, which are then transformed into the synchronous frame via the Park Transform to perform the control in the synchronous reference frame.

When an offset error of a given magnitude occurs in a phase current measurement, the closed loop current control operating in the synchronous reference frame adjusts the motor voltage so that the measurement of motor current matches the command. Since the measurement is incorrect, the actual motor currents are also incorrect. The failure mode results in motor position dependent motor torque and current errors, which may be perceived as a large torque ripple at the motor shaft, and potentially larger than rated motor currents (for the hardware design). When the torque ripple caused by the phase current measurement offset error exceeds a certain threshold, the offset error can produce motor torque in the opposite direction from the motor torque command. When used in EPS systems, failures which produce torque in a direction opposite to the desired motor torque command result in efforts above manual from the driver.

SUMMARY

In an embodiment, a system for detecting current measurement offset error in a motor control system is provided. The system includes a programmable high pass filter module configured to filter a final voltage command and generate a filtered final voltage command that includes the sinusoidal component, a gain and phase compensation module configured to perform a gain compensation and a phase compensation on the filtered final voltage command to generate a compensated final voltage command. An error detection module is configured to determine an offset of the compensated final voltage command in a stator reference frame.

In another embodiment of the invention, a method for detecting current measurement offset error in a power steering system is provided. The method includes determining a voltage difference of a reference voltage command and a final voltage command in a rotor reference frame, the voltage difference includes a constant component and a sinusoidal component. The method further includes filtering the voltage difference to generate a filtered voltage difference that includes the sinusoidal component. The method further includes performing a gain compensation and a phase compensation on the filtered voltage difference to generate a compensated voltage difference. The method further includes determining an offset of the compensated voltage difference in a stator reference frame.

In another embodiment of the invention, a system for detecting current measurement offset error in a power steering system is provided. The system includes a voltage difference calculation module configured to determine a voltage difference of a reference voltage command and a final voltage command in a rotor reference frame, the voltage difference includes a constant component and a sinusoidal component. The system further includes a programmable high pass filter module configured to filter the voltage difference and generate a filtered voltage difference that includes the sinusoidal component. The system further includes a gain and phase compensation module configured to perform a gain compensation and a phase compensation on the filtered voltage difference to generate a compensated voltage difference. The system further includes an error detection module configured to determine an offset of the compensated voltage difference in a stator reference frame.

These and other advantages and features will become more apparent from the following description taken in conjunction with the drawings.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIG. 7 depicts plots that illustrate continuous and discrete time implementation of an adaptive low pass filter in accordance with some embodiments;

DETAILED DESCRIPTION

Figure 1:
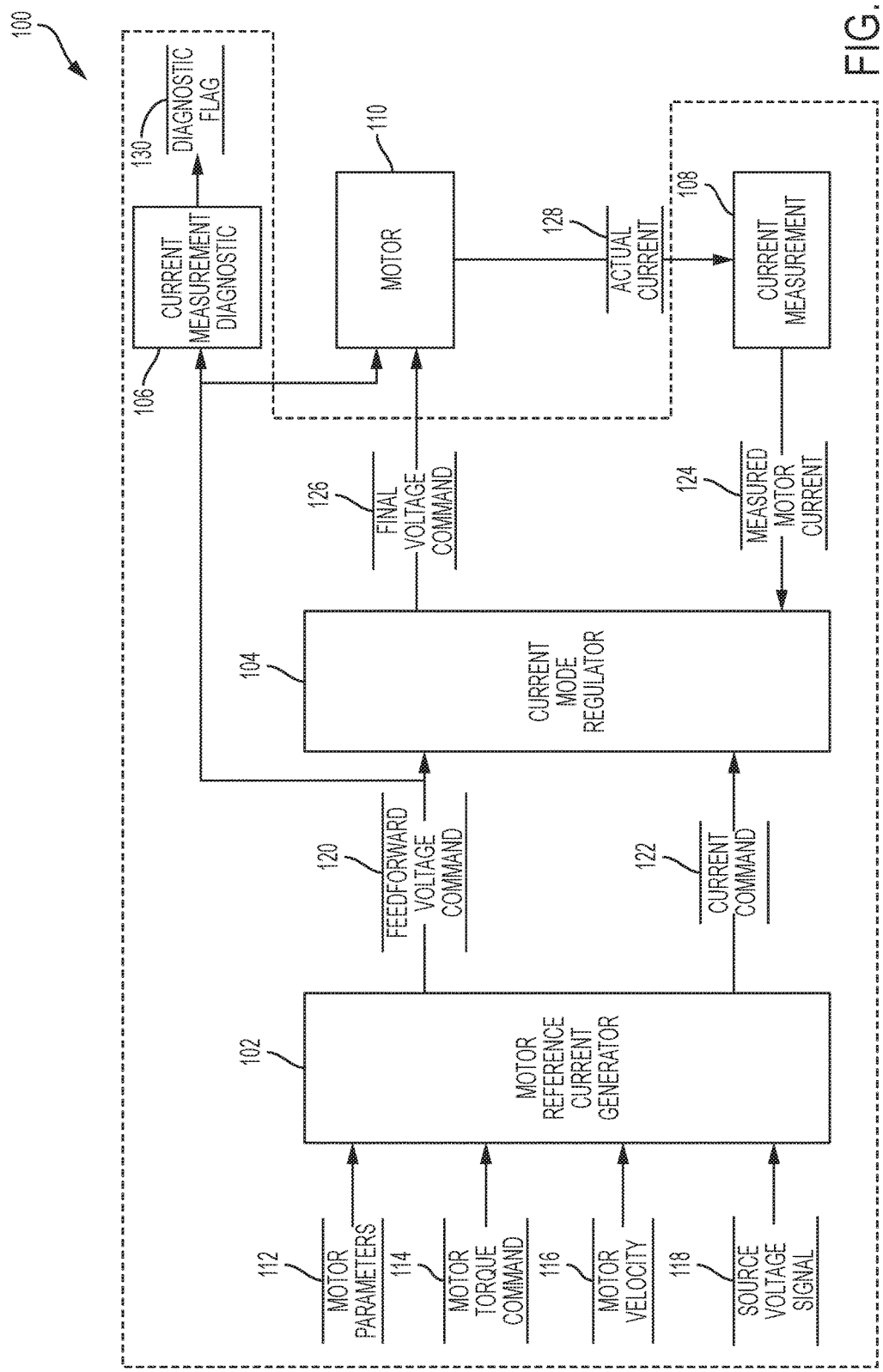
FIG. 1 is an exemplary schematic illustration of a motor control system in accordance with one embodiment.

Referring now to the Figures, where the invention will be described with reference to specific embodiments, without limiting same, FIG. 1 depicts a block diagram of a torque control module 100 of a poly-phase permanent magnet synchronous machine (PMSM), utilizing phase current measurements in a current control feedback loop in accordance with some embodiments of the invention. As shown, the torque control module 100 includes a motor reference current generator 102, a current regulator module 104, and a current measurement diagnostic module 106. FIG. 1 also depicts a current measurement module 108 and a motor 110.

As used herein, the term "module" or "sub-module" refers to an application specific integrated circuit (ASIC), an electronic circuit, a processor (shared, dedicated, or group) and memory that executes one or more software or firmware programs, a combinational logic circuit, and/or other suitable components that provide the described functionality. When implemented in software, a module or a sub-module can be embodied in memory as a non-transitory machine-readable storage medium readable by a processing circuit and storing instructions for execution by the processing circuit for performing a method. Moreover, the modules and sub-modules shown in the Figures may be combined and/or further partitioned.

The motor reference current generator 102 generates a feedforward voltage command 120 and a current command 122 based on input signals, including a motor torque command 114, a motor velocity 116, a source voltage signal 118, and motor parameters 112. The motor torque command 114 represents a commanded torque value, and may be derived from another torque control module (not shown), or may correspond to a torque value generated by an operator. The motor velocity 116 is an angular speed of the motor 110 measured by a speed sensor (not shown). The speed sensor may include, for example, an encoder and a speed calculation circuit for calculating the angular speed of a rotor of the motor 110 based on a signal received by the encoder. The source voltage signal 118 represents a bridge voltage from a DC power source (not shown).

The motor parameters 112 are estimated values for the motor 110, including, for example, a motor constant $K_e$ (Volt/rad/s), a motor circuit resistance R (Ohm), a direct axis inductance $L_d$ (Henry) and a quadrature axis inductance $L_q$ (Henry).

In some embodiments, the current command 122 generated by the motor reference current generator 102 includes a reference d-axis current command and a reference q-axis current command based on the motor torque command 114, the source voltage signal 118, and the angular speed. The motor reference current generator 102 also calculates the feedforward voltage command 120, which may include a feedforward d-axis voltage command and a feedforward q-axis voltage command. The feedforward voltage command 120 and the current command 122 satisfy the motor torque command 114.

The current regulator module 104 determines a final voltage command 126 based on the feedforward voltage command 120, the current command 122, and the measured motor currents 124. The measured motor currents 124 include a measured d-axis current and a measured q-axis current, which are transformed from the current measurement signals in the stator reference frame.

The feedforward voltage commands are typically different for different types of current regulator designs. It should be understood that the feedforward voltage terms used for the current measurement offset diagnostic implementation may be similar or identical to feedforward voltage terms for motor control using pure static feedforward control. Further, the final voltage commands may be the output of the current regulator. However, the actual voltages applied by the inverter to the motor, or any other suitable voltages, may also be used instead of a final voltage command if a measurement of those voltages is available.

The current regulator module 104 sends the final voltage command 126 to the motor 110 to control the motor. Specifically, in some embodiments, a polar conversion controller (not shown) receives as inputs the d-axis voltage command and the q-axis voltage command. Based on the inputs, the polar conversion controller determines a voltage command and a phase advance angle. A PWM inverter controller (not shown) then receives as input signals the voltage command and the phase advance angle from the polar conversion controller. The PWM inverter controller also receives a rotor angle value of the motor 110 measured by a motor position sensor (not shown). In some embodiments, the PWM inverter controller may include an over-modulation space vector PWM unit that generates three respective duty cycle values. The duty cycle values are used to drive gate drive circuits of an inverter (not shown) that energize phases of the motor 110.

For feedback control purposes, the current measurement module 108 generates measured motor currents 124 based on the actual currents 128 from the motor 110. In some embodiments, the current measurement module 108 includes current measurement sensors that generate the measured motor currents 124 from the actual currents 128 transmitted to the motor 110. The measured motor currents 124 therefore represent the values of phase currents (e.g. two phase, three phase) measured by the current measurement module 108. In some embodiments, the current measurement module 108 converts measured values of the AC phase currents into equivalent measured DC current components, which are a measured d-axis current and a measured q-axis current in the d/q reference frame (rotor reference frame).

In operation, the actual currents 128 may have offset errors in the stationary reference frame. The measured actual currents, including the offset errors in the αβ frame, which is also the stationary frame and represents the phase currents. The stationary reference frame may be expressed according to the following equations:

$$I_{\alpha m} = I_\alpha - \Delta I_\alpha$$

$$I_{\beta m} = I_\beta - \Delta I_\beta$$

where $I_{\alpha m}$ and $I_{\beta m}$ are the respective measured currents in the stationary reference frame, $I_\alpha$ and $I_\beta$ are the actual currents in the stationary reference frame, $\Delta I_\alpha$ and $\omega I_\beta$ are the current measurement offset errors expressed in the stationary reference frame. The stationary reference frame may be used to simplify mathematical derivations shown here.

When transformed into the synchronous reference frame, the measured motor currents are in the rotating reference frame and can be expressed as:

$$\begin{aligned} I_{dm} &= I_d - \Delta I_d \\ &= I_d - I_0 \cos(\theta - \phi) \\ I_{qm} &= I_q - \Delta I_q \\ &= I_q - I_0 \sin(\theta - \phi) \end{aligned}$$

where $I_0 = \sqrt{\Delta I_\alpha^2 + \Delta I_\beta^2}$ and $$\phi = \tan^{-1}\left(\frac{\Delta I_\beta}{\Delta I_\alpha}\right).$$

In operation, the measured motor currents 124 may become equal to the current command 122, resulting in distortion of the actual currents 128. This distortion is propagated through the torque control module 100, causing a d/q offset error between the feedforward voltage command 120 and the final voltage command 126 in the synchronously rotating reference frame. The d/q offset error (rotating reference frame offset error) under the assumption of accurate parameter estimation can be expressed as:

$$\Delta V_d = -\Delta I_0(R\cos(\theta-\varphi) + \omega_e(L_q-L_d)\sin(\theta-\varphi))$$

$$\Delta V_q = -\Delta I_0(R\cos(\theta-\varphi) + \omega_e(L_q-L_d)\sin(\theta-\varphi))$$

where $\omega_e$, R, $L_d$, $L_q$ are synchronous frequency (electrical motor velocity), the motor resistance, d-axis inductance and q-axis inductance respectively. When these voltages are transformed back to the stationary frame, the offset in the voltage signals stationary reference frame remains.

In the stationary reference frame, the voltage offset signals may be expressed as $\Delta V_\alpha$, $\Delta V_\beta$. The voltage offsets $\Delta V_\alpha$, $\Delta V_\beta$ in the stationary reference frame contain respective constant components and respective sinusoidal components. The sinusoidal components may be equal to twice a synchronous frequency of the motor and generally has a small effect on the stationary reference frame offsets $\Delta V_\alpha$, $\Delta V_\beta$.

The d/q voltage offsets contain a constant term in addition to the sinusoidal term due to parameter errors, which transform into sinusoidal components when transformed into the stationary frame. Furthermore, depending on the specific parameter, these terms may be functions of the synchronous frequency, and become larger in magnitude with increasing speed.

The current measurement diagnostic module 106 removes the constant component of the d/q voltage offsets to increase the accuracy of the error condition detection after transformation into the stationary reference frame.

Specifically, the current measurement diagnostic module 106 determines whether the measured motor currents 124 generated by the current measurement module 108 represent correct measurements. That is, the current measurement diagnostic module 106 determines whether one or more of the phase current measurement sensors of the current measurement module 108 have an acceptable level of current measurement offset error by analyzing the stationary reference frame voltage offsets $\Delta V_\alpha$, and $\Delta V_\beta$.

The current measurement diagnostic module 106 compares the final voltage command 126 with the feedforward voltage commands 120 to determine whether the phase current measurement has a stationary reference frame offset error that is large enough to indicate the sensor disablement or failure. In some embodiments, the current measurement diagnostic module 106 determines that the received voltage commands indicate no offset error in the current measurement. The current measurement diagnostic module 106 generates a diagnostic flag 130 when the stationary reference frame offset errors in the current measurement exceeds a threshold, for example. Diagnostic defects may introduce offset error in phase current measurements. The systems and methods described below increase the robustness of the diagnostic.

Figure 2:
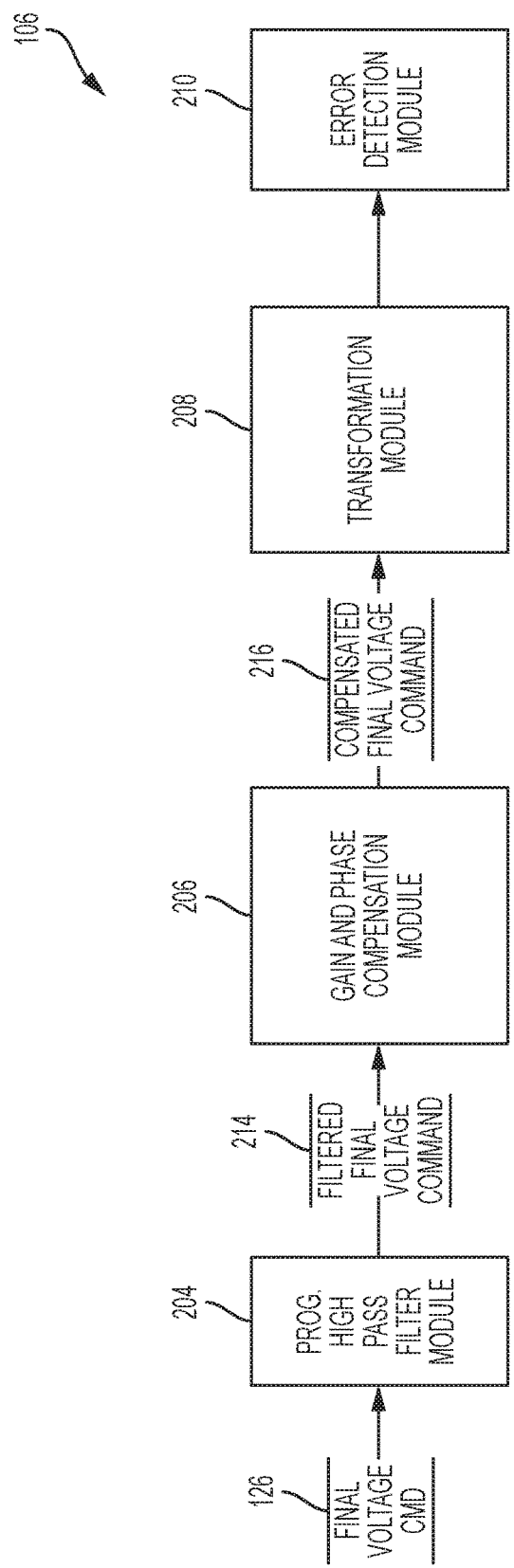
FIG. 2 illustrates a schematic diagram of a phase current measurement diagnostic module in accordance with some embodiments.

FIG. 2 illustrates the current measurement diagnostic module 106 of some embodiments in more detail. As shown, the current measurement diagnostic module 106 includes a programmable high pass filter module 204, a gain and phase compensation module 206, a transformation module 208, and an error detection module 210.

The programmable high pass filter module 204 receives the final voltage command 126. The programmable high pass filter module 204 is configured to filter the final voltage command 126, resulting in a removal of constant components from the final voltage command 126. Accordingly, the programmable high pass filter module 204 is configured to generate a filtered final voltage command 214 that includes the sinusoidal component of the final voltage command 126, without the constant components. Accordingly, the programmable high pass filter module 204 may have a cutoff frequency that proportional to a synchronous frequency $\omega_e$ of the motor 110 (FIG. 1). The programmable high pass filter module 204 may be programmed based on a calibratable constant value. The calibratable constant value may be tuned to reduce gain and phase error in the sinusoidal voltage component. A transfer function of the programmable high pass filter module 204 may be written as follows:

$$H(s) = \frac{s}{s + k\omega_e}$$

where, k is the calibratable constant, which may be tuned to reduce gain and phase error in the sinusoidal component. The programmable high pass filter module 204 may utilize the synchronous frequency $\omega_e$ and the gain and phase error introduced by the filter is static. Also, with the programmable high pass filter module 204, the calibratable constant k may be independently tuned to ensure minimal distortion of the input signal. The programmable high pass filter module 204 is not limited to the above embodiment. For instance, a higher order filter may be used, so long as the programmable filter removes the constant component of the final voltage command 126.

The filtered final voltage command 214 is sent to a gain and phase compensation module 206. The programmable high pass filter module 204 may introduce magnitude and phase errors to filtered final voltage command 214, requiring a compensation to be performed by the gain and phase compensation module 206. In some embodiments, the gain and phase compensation module 206 includes a first-order unity gain programmable low-pass filter (PLPF) with the following transfer function:

$$L(s) = \frac{k'\omega_e}{s + k'\omega_e}$$

The first-order unity gain programmable low-pass filter may compensate filtered final voltage command 214 to restore the gain and phase of the final voltage command 126. The compensation may be performed according to constraint equations written as:

$$\angle H(j\omega_e) - \angle L(j\omega_e) = 0$$

$$|H(j\omega_e)L(j\omega_e)| = 1$$

In other embodiments, the gain and phase compensation module 206 may utilize a second order low-pass filter with a transfer function shown below.

$$L(s) = \frac{k'^2\omega_e^2}{s^2 + 2\zeta k'\omega_e s + k'^2\omega_e^2}$$

The second order low-pass filter shown above may allow for more specific transient responses by using two tuning parameters k' and ζ. The gain and phase compensation will require different k' and ζ respectively to achieve the steady state specifications, which must be calculated appropriately with the method presented above.

The gain and phase compensation module 206 generates a compensated final voltage command 216 that is sent to a transformation module 208 for processing. Specifically, the transformation module 208 typically utilizes an inverse Park transformation or a similar mathematical transformation to convert the measured phase currents in the DC frame (rotor reference frame, or d/q reference frame) to the AC frame (stator reference frame), simplifying the analysis of the error determination. The output of the transformation module 208 is sent to error detection module 210 as a transformed voltage offset, which is represented in a stator frame. The error detection module 210 determines a magnitude of the transformed voltage offset as compared to a threshold value, for example, in a stator reference frame, and determines whether a current measurement offset error is present.

The current measurement diagnostic module 106 provides diagnostic robustness for high synchronous frequencies, as well as a full spectrum of synchronous frequencies.

The programmable high pass filter module 204 and the gain and phase compensation module 206 may be digitally implemented to mitigate a difference in magnitude and phase of a continuous time filter. The digital implementation of the programmable high pass filter module 204 and the gain and phase compensation module 206 may be based on the synchronous frequency but implemented in a discrete domain, as shown in the following equation, where $\omega_e$ is a synchronous frequency of a motor of the power steering system and $T_s$ is a sampling time:

$$s = \frac{\omega_e}{\tan\left(\frac{\omega_e T_s}{2}\right)} \frac{1 - z^{-1}}{1 + z^{-1}}$$

Although the programmable high pass filter module 204 is a first order filter in FIG. 2, it is further contemplated and understood that the programmable high pass filter module 204 may of higher order, a second order filter for example.

Figure 3:
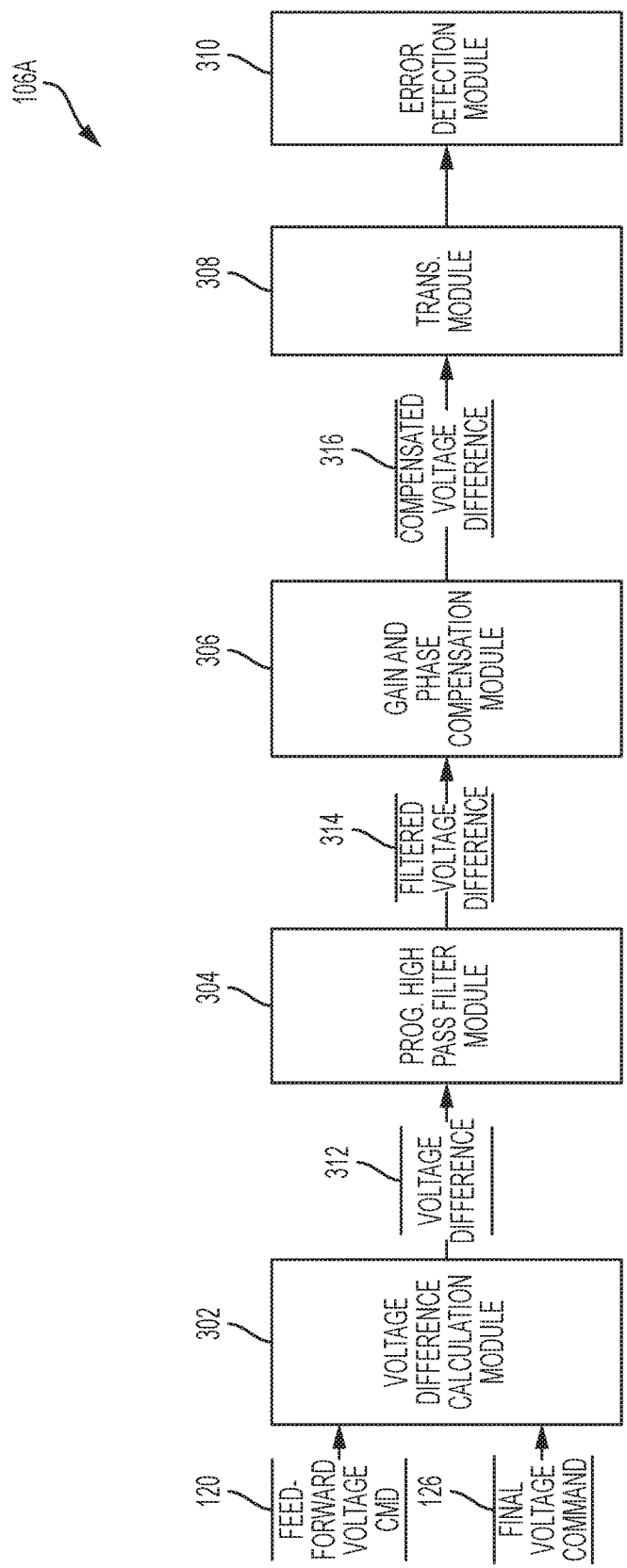
FIG. 3 illustrates a schematic diagram of a phase current measurement diagnostic module in accordance with another embodiment.

FIG. 3 illustrates a phase current measurement diagnostic module of another embodiment in more detail. As shown, the phase current measurement diagnostic module 106A includes a voltage difference calculation module 302, a programmable high pass filter module 304, a gain and phase compensation module 306, a transformation module 308, and an error detection module 310.

The voltage difference calculation module 302 calculates a voltage difference 312 based on the feedforward voltage command 120 and the final voltage command 126. In some embodiments, the voltage difference 312 is represented in the d/q domain as a d/q offset, by determining the feedforward voltage command 120 and the final voltage command 126. The voltage difference 312 may have a constant component and a sinusoidal component, both of which are represented in the d/q reference frame.

The programmable high pass filter module 304 receives the voltage difference 312. The programmable high pass filter module 304 is configured to filter the voltage difference 312, resulting in a removal of the constant component. Accordingly, the programmable high pass filter module 304 is configured to generate a filtered voltage difference 314 that includes the sinusoidal component of the voltage difference 312, without the constant component. Accordingly, the programmable high pass filter module 304 may have a cutoff frequency that proportional to a synchronous frequency $\omega_e$ of the motor 110 (FIG. 1). The programmable high pass filter module 304 may be programmed based on a calibratable constant value. The calibratable constant value may be tuned to reduce gain and phase error in the sinusoidal voltage component. A transfer function of the programmable high pass filter module 304 may be written as follows:

$$H(s) = \frac{s}{s + k\omega_e}$$

where, k is the calibratable constant, which may be tuned to reduce gain and phase error in the sinusoidal component. The programmable high pass filter module 304 may utilize the synchronous frequency $\omega_e$ and the gain and phase error introduced by the filter is static. Also, with the programmable high pass filter module 304, the calibratable constant k may be independently tuned to ensure minimal distortion of the input signal. The programmable high pass filter module 304 is not limited to the above embodiment. For instance, a higher order filter may be used, so long as the programmable filter removes the constant component of the voltage difference 312.

The filtered voltage difference 314 is sent to a gain and phase compensation module 306. The programmable high pass filter module 304 may introduce magnitude and phase errors to filtered voltage difference 314, requiring a compensation to be performed by the gain and phase compensation module 306. In some embodiments, the gain and phase compensation module 306 includes a first-order unity gain programmable low-pass filter (PLPF) with the following transfer function:

$$L(s) = \frac{k'\omega_e}{s + k'\omega_e}$$

The first-order unity gain programmable low-pass filter may compensate filtered voltage difference 314 to restore the gain and phase of the voltage difference 312. The compensation may be performed according to constraint equations written as:

$$\angle H(j\omega_e) - \angle L(j\omega_e) = 0$$

$$|H(j\omega_e)L(j\omega_e)| = 1$$

In other embodiments, the gain and phase compensation module 306 may utilize a second order low-pass filter with a transfer function shown below.

$$L(s) = \frac{k'^2\omega_e^2}{s^2 + 2\zeta k'\omega_e s + k'^2\omega_e^2}$$

The second order low-pass filter shown above may allow for more specific transient responses by using two tuning parameters k' and ζ. The gain and phase compensation will require different ζ and k' respectively to achieve the steady state specifications, which must be calculated appropriately with the method presented above.

The gain and phase compensation module 306 generates a compensated voltage difference 316 that is sent to a transformation module 308 for processing. Specifically, the transformation module 308 typically utilizes an inverse Park transformation or a similar mathematical transformation to convert the measured phase currents in the DC frame (rotor reference frame, or d/q reference frame) to the AC frame (stator reference frame), simplifying the analysis of the error determination. The output of the transformation module 308 is sent to error determination module 310 as a transformed voltage offset, which is represented in a stator frame. The error detection module 310 determines a magnitude of the transformed voltage offset as compared to a threshold value, for example, in a stator reference frame. The error detection module 310 may determine whether a current measurement offset error exists based on the transformed voltage offset.

The phase current measurement diagnostic module 106A provides diagnostic robustness for high synchronous frequencies, as well as a full spectrum of synchronous frequencies.

The programmable high pass filter module 304 and the gain and phase compensation module 306 may be digitally implemented to mitigate a difference in magnitude and phase of a continuous time filter. The digital implementation of the programmable high pass filter module 304 and the gain and phase compensation module 306 may be based on the synchronous frequency but implemented in a discrete domain, as shown in the following equation:

$$s = \frac{\omega_e}{\tan\left(\frac{\omega_e T_s}{2}\right)} \frac{1-z^{-1}}{1+z^{-1}}$$

Figure 4:
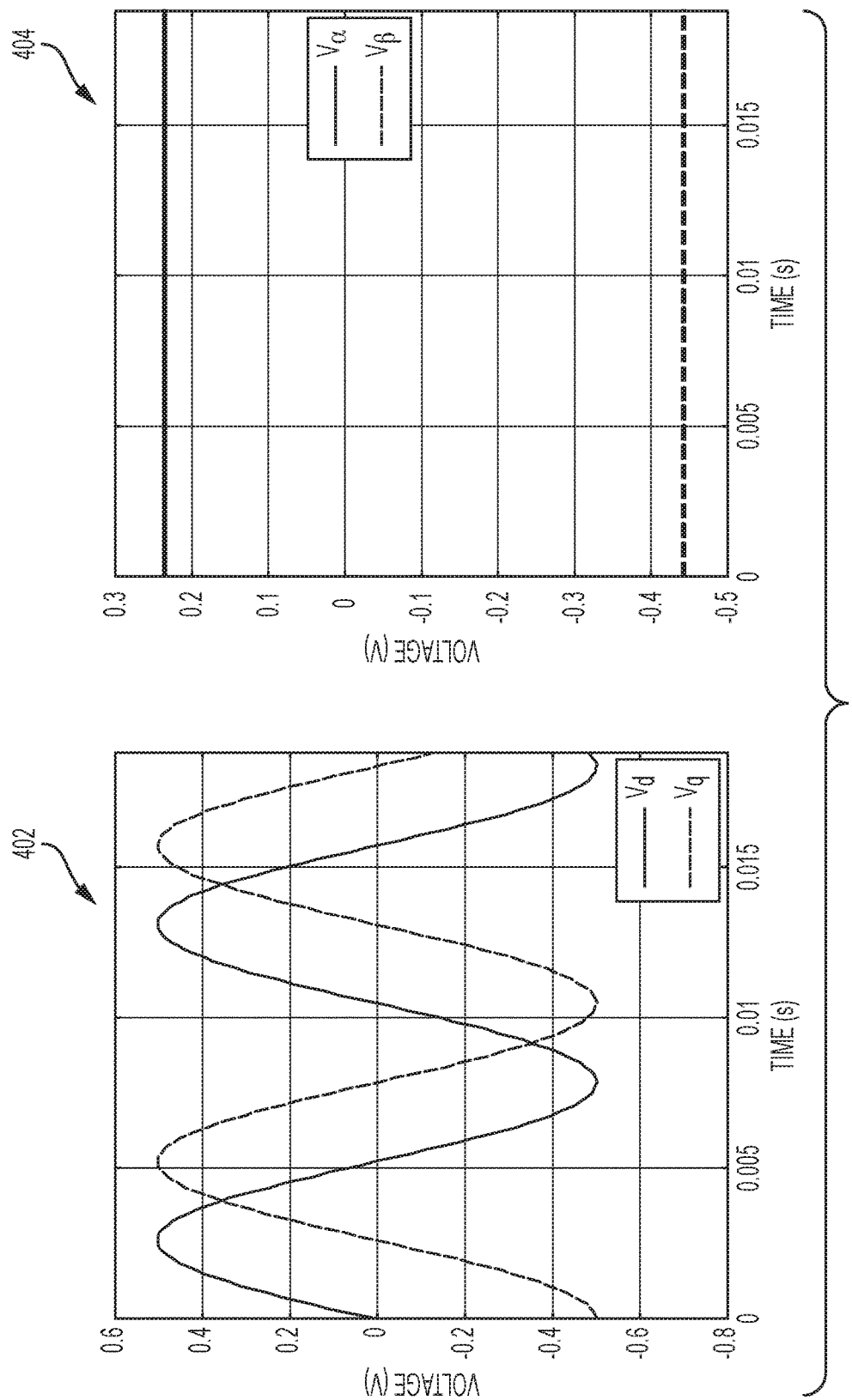
FIG. 4 depicts plots that illustrate processing results in accordance with some embodiments.

FIG. 4 shows two plots, a first plot 402 illustrates $V_d$, and $V_q$ under the presence of a current measurement offset error. A result of the processing by the current measurement diagnostic module 106 (e.g. FIG. 3) is shown at second plot 404. As can be appreciated, the phase current offset show up as voltage offsets in $V_\alpha$ and $V_\beta$.

Figure 5:
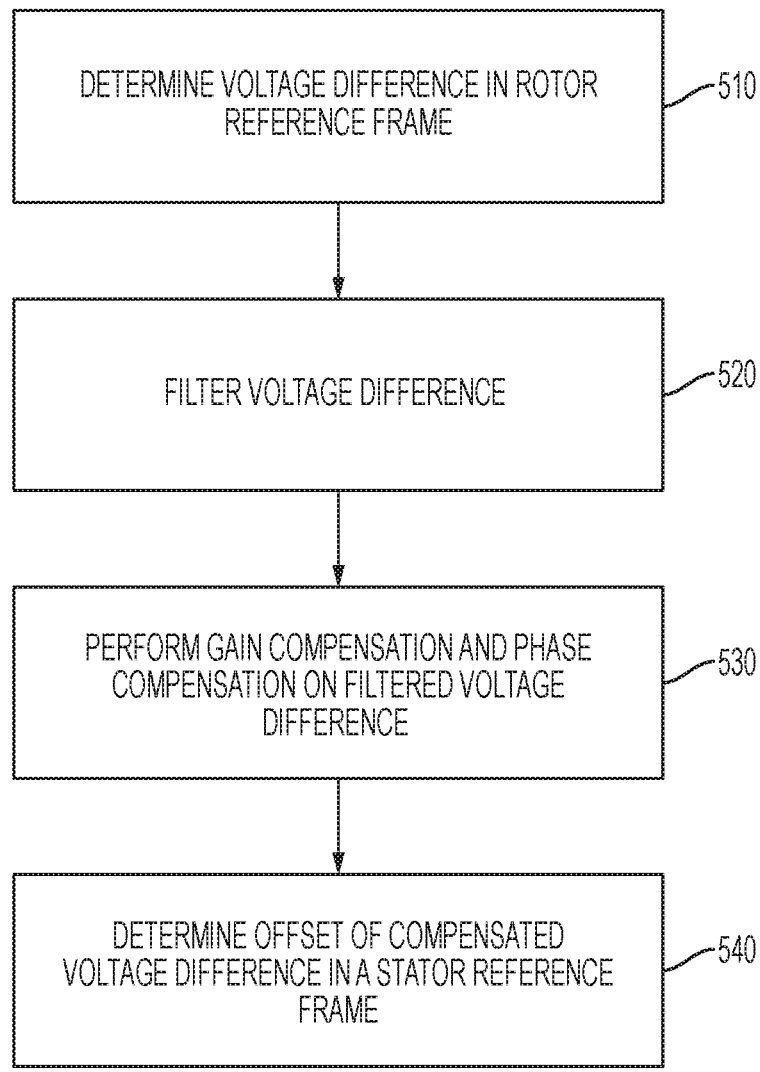
FIG. 5 illustrates a method of determining an offset error in accordance with one embodiment.

FIG. 5 is a flow diagram for a control method that can be performed by the torque control module 100 (FIG. 1) in accordance with some embodiments of the invention.

As can be appreciated in light of the disclosure, the order of operation within the method is not limited to the sequential execution as illustrated in FIG. 5, but may be performed in one or more varying orders as applicable and in accordance with the present disclosure.

At block 510, the torque control module 100 determines a voltage difference of a reference voltage command and a final voltage command in a rotor reference frame. The final voltage difference includes a constant component and a sinusoidal component. At block 520, the torque control module 100 filters the final voltage difference to generate a filtered final voltage difference that includes the sinusoidal component.

At block 530, the torque control module 100 performs a gain compensation and a phase compensation on the filtered final voltage difference to generate a compensated final voltage difference. The phase compensation may restore the gain and phase of the voltage difference with a first or second order filter, for example.

At block 540, the torque control module 100 determines an offset of the compensated final voltage difference in a stator reference frame. The torque control module 100 may also send the direct-axis voltage signal and the quadrature-axis voltage signal to the motor to control the motor. In some embodiments, the torque control module 100 causes a status indicating the correctness or incorrectness of the current measurement to be displayed. For instance, torque control module 100 outputs the status to an operator or a technician for diagnosing the motor current sensor functioning.

Described further are technical solutions that further improve the robustness of the diagnostic scheme to machine parameter errors by implementing adaptive low-pass filters in a stationary frame. The technical solutions described earlier facilitate performing adaptive band-pass filtering in the synchronous frame to extract only the first order terms caused by current measurement offset errors, after which the transformation to the stationary frame is performed. While such technical solutions remove the erroneous terms caused by the parameter estimation errors at high speeds, because of the adaptive implementation, the technical solutions further remove the diagnostic information at zero speeds (speeds below a predetermined threshold), where both parameter estimation errors as well as diagnostic terms are constant. Such technical solutions thus facilitate diagnosing the current offset errors for speed control applications where the speed is primarily non-zero (above the predetermined threshold). However, for torque control applications such as in an EPS operating mostly near zero speed, the diagnostic ability near zero speed may be reduced, leading to non-compliance with safety requirements, and moreover, safety issues for a vehicle equipped with the EPS. It should be further noted that the technical solutions described so far may use a blending technique to disable filters near zero speed so that the diagnostic for the current measurement offset errors can also be used at zero motor speed. The technical solutions described further, address detecting and handling of the current measurement offset errors near zero speed, without using extra logic that is specific for the near zero speed scenario.

The technical solutions described further address the technical problems by facilitating diagnosis at zero-speeds in addition to non-zero speeds. The technical solutions facilitate operating the EPS in a similar manner as using adaptive band-pass filters in the synchronous reference frame in the high-speed range, and yet retaining the ability to detect offset errors at the cost of reduced robustness to parameter errors at zero speed. Due to the adaptive filtering technique, the diagnostic scheme has a variable detection time, which facilitates the EPS to meet stricter safety compliance requirements. Further, the error detection is improved such that the detection is more consistent and facilitates faster diagnostic calibration.

The technical solutions described further are implemented using components illustrated in FIG. 1 for the torque control of a multi-phase PMSM utilizing phase current measurements in a current control feedback loop, along with a current measurement diagnostic block 106, which utilizes feedforward and final motor voltage command signals to detect the specific phase current measurement shunt containing the offset error.

The current measurements with offset errors in a three-phase abc stationary reference frame can be mathematically expressed as, $$I_{am} = I_a - \Delta I_a$$

$$I_{bm} = I_b - \Delta I_b$$

$$I_{cm} = I_c - \Delta I_c$$

The transformation (using Clarke transform) to the two-phase αβ stationary frame gives, $$I_{am} = I_\alpha - \Delta I_\alpha$$

$$I_{\beta m} = I_\beta - \Delta I_\beta$$

where $$\Delta I_\alpha = \frac{2\Delta I_a - \Delta I_b - \Delta I_c}{3} \text{ and } \Delta I_\beta = \pm \frac{\Delta I_b - \Delta I_c}{\sqrt{3}}.$$

The + and − signs in the $\Delta I_\beta$ term signs are for positive and negative electromechanical polarity systems respectively. It should be noted that this sign difference facilitates configuring the detection algorithm for the two system configurations. The examples described herein use the a positive electromechanical polarity system for description and explanation purposes, however, based on the description herein, it will be obvious to a person skilled in the art that the technical solutions herein are similarly applicable for negative electromechanical polarity systems as well. Additionally, for systems with two measurements, say for phases b and c, the aforementioned calculations may be modified by setting $\Delta I_\alpha = -\Delta I_b - \Delta I_c$.

The transformation matrix for converting between the abc and $\alpha\beta$ stationary frames is, $$\begin{bmatrix} \alpha \\ \beta \\ 0 \end{bmatrix} = \frac{2}{3} \begin{bmatrix} \cos 0 & \cos\left(\frac{2\pi}{3}\right) & \cos\left(-\frac{2\pi}{3}\right) \\ \sin 0 & \sin\left(\frac{2\pi}{3}\right) & \sin\left(-\frac{2\pi}{3}\right) \\ \frac{1}{2} & \frac{1}{2} & \frac{1}{2} \end{bmatrix} \begin{bmatrix} a \\ b \\ c \end{bmatrix}$$

The $\alpha\beta$ transformation is a projection of the phase quantities from the three-axis frame onto a stationary two-axis reference frame, by preserving amplitude of the electrical parameters to which it is applied. For example, in the above, the amplitudes of the currents in the $\alpha\beta$ reference frame are the same of that in the abc reference frame.

Figure 6:
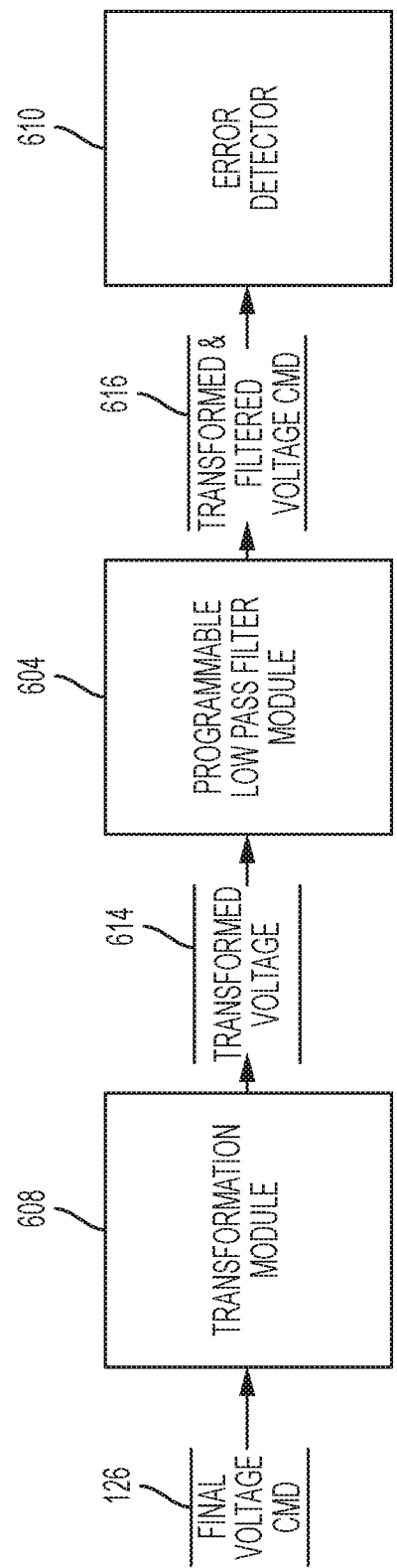
FIG. 6 illustrates a schematic diagram of a phase current measurement diagnostic module in accordance with another embodiment.

According to one or more examples, the current measurement diagnostic block 106 may be implemented using components as illustrated in FIG. 6. As shown, the current measurement diagnostic module 106 according to this embodiment includes a programmable low pass filter module 604, a transformation module 608, and an error detection module 610.

Further, in this case, the transformation module 608 receives the final voltage command 126. In one or more examples, a gain and phase compensation module (such as 206 in FIG. 2) generates the final voltage command 126, and precedes the transformation module 608. The transformation module 608 may utilize an inverse Park transformation or a similar mathematical transformation to convert the measured phase voltages in the DC frame (rotor reference frame, or d/q reference frame) to the AC frame (stator reference frame).

The transformed final voltage command 614 that is output by the transformation module 608 is sent to the programmable low-pass filter module 604. The programmable low pass filter module 604 filters the transformed final voltage command 614, resulting in a removal of constant components from the transformed final voltage command 614. Accordingly, the programmable low pass filter module 604 generates a filtered transformed final voltage command 616 that includes the sinusoidal component of the final voltage command 126, without the constant components. It should be noted that after the transformation, the sinusoidal component of the final voltage command 126 becomes constant in the stationary frame whereas the constant components introduced by parameter estimation in the synchronous frame become sinusoidal components, which are filtered by the adaptive low-pass filters.

Accordingly, this scheme performs adaptive low-pass filtering in the stator frame to extract only the first order terms caused by current measurement offset errors, after the transformation to the stationary frame is performed. Thus, the scheme does removes all the erroneous terms caused by the parameter estimation errors at high speeds, due to the adaptive implementation, but also facilitates maintaining the diagnostic information at zero (or low speeds) speed, where both parameter estimation errors as well as diagnostic terms are constant. Accordingly, the technical solutions facilitate torque control applications for the EPS, even when the EPS motor is operating almost near or at zero speed, for example at speeds below a predetermined threshold (for example, 10 rad/s, 5 rad/s, 2 rad/s, and so on).

In one or more examples, the low pass filter module 604 uses a first order filter that has a structure, $$L(s) = \frac{k\tilde{\omega}_e}{s + k\tilde{\omega}_e}$$

where k is a tunable parameter, which may be based on the synchronous frequency or electrical speed of the motor 110.

Alternatively, the low pass filter module 604 uses a second order filter, which provides additional tuning flexibility, such as, $$L(s) = \frac{k^2 \tilde{\omega}_e^2}{s^2 + 2\zeta k \tilde{\omega}_e^2 s + k^2 \tilde{\omega}_e^2}$$

The tuning variable may be tuned for rejecting frequency components at the synchronous frequency $\omega_e$ of the motor 110 and above, which facilitates the DC components to pass. This is because in the stationary frame, the current measurement offset error is DC, while the erroneous components are pulsating in nature. For example, in the first order filter, the parameter k may be between 0 and 1, such as 0.5.

Alternatively, or in addition, for discrete implementation of the low pass filter module 604, a transformation, such as the Tustin transform may be used.

The low pass filters for the low pass filter module 604 may be digitally implemented to mitigate a difference in magnitude and phase of a continuous time filter. For example, the s to z domain expression of the Tustin transform is given by, $$s = \frac{2}{T_s} \frac{1 - z^{-1}}{1 + z^{-1}}$$

where $T_s$ is the sampling time of the control loop in which the diagnostic is implemented.

FIG. 7 illustrates plots of frequency and step responses of the continuous-time and discrete-time first order low pass filters for two different speeds. It will be appreciated that the step responses clearly show the variable detection time with changing synchronous frequencies of the motor 110.

The output of the low-pass filter module 604 is sent to the error detection module 610 as a filtered transformed voltage offset, which is represented in the stator frame. The error detection module 610 determines a magnitude of the filtered transformed voltage offset as compared to a predetermined threshold value in the stator reference frame, and determines whether a current measurement offset error is present. The error detection module 610 is similar to the error detection module 210 (and/or 310) described earlier, and may include an error comparison logic along with one or more PN counters.

Figure 8:
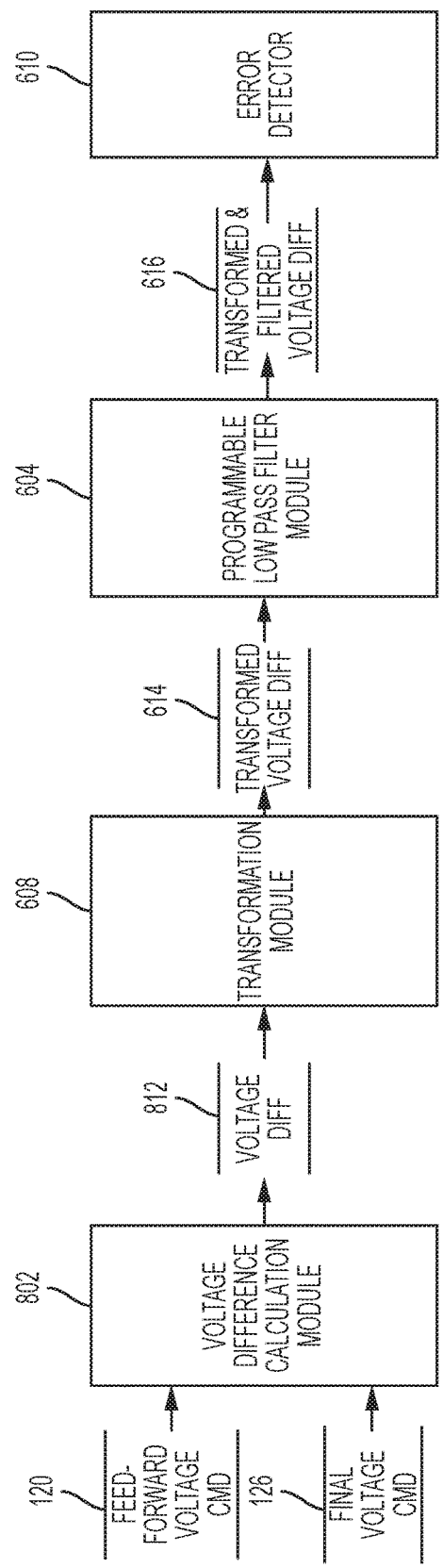
FIG. 8 illustrates a schematic diagram of a phase current measurement diagnostic module in accordance with another embodiment.

In yet another embodiment, illustrated by FIG. 8, the phase current measurement diagnostic module 106 includes a voltage difference calculation module 802, along with the programmable low pass filters 604, the transformation module 608, and the error diagnostic module 610.

The voltage difference calculation module 802 calculates a voltage difference 812 based on the feedforward voltage command 120 and the final voltage command 126. In some embodiments, the voltage difference 812 is represented in the d/q domain as a d/q offset, by determining the feedforward voltage command 120 and the final voltage command 126. The voltage difference 812 may have a constant component and a sinusoidal component, both of which are represented in the d/q reference frame.

The difference calculation removes low frequency components (due to varying operating conditions) before the transformation of the voltages into stationary frame by the transformation module 608. The resulting voltage difference 812 is passed to the transformation module 608, which transforms the difference to the stationary reference frame. The transformed voltage difference is then passed to the low pass filter module 604.

In this scheme, there are two adaptive low-pass filters, one each for the two voltages, $V_d$ and $V_q$. The low pass filter module 604, may use a first order low pass filter and/or a higher order low pass filter, such as a second order low pass filter, as described earlier, with a tunable factor that is adapted according to the frequency of the motor 110.

The output of the low pass filter module 604 is sent to the error determination module 610 as a transformed and filtered voltage offset 616, which is in a stator frame. The error detection module 610 determines a magnitude of the transformed voltage offset as compared to a threshold value, for example, in a stator reference frame. The error detection module 310 may determine whether a current measurement offset error exists based on the transformed and filtered voltage offset 616.

Figure 9:
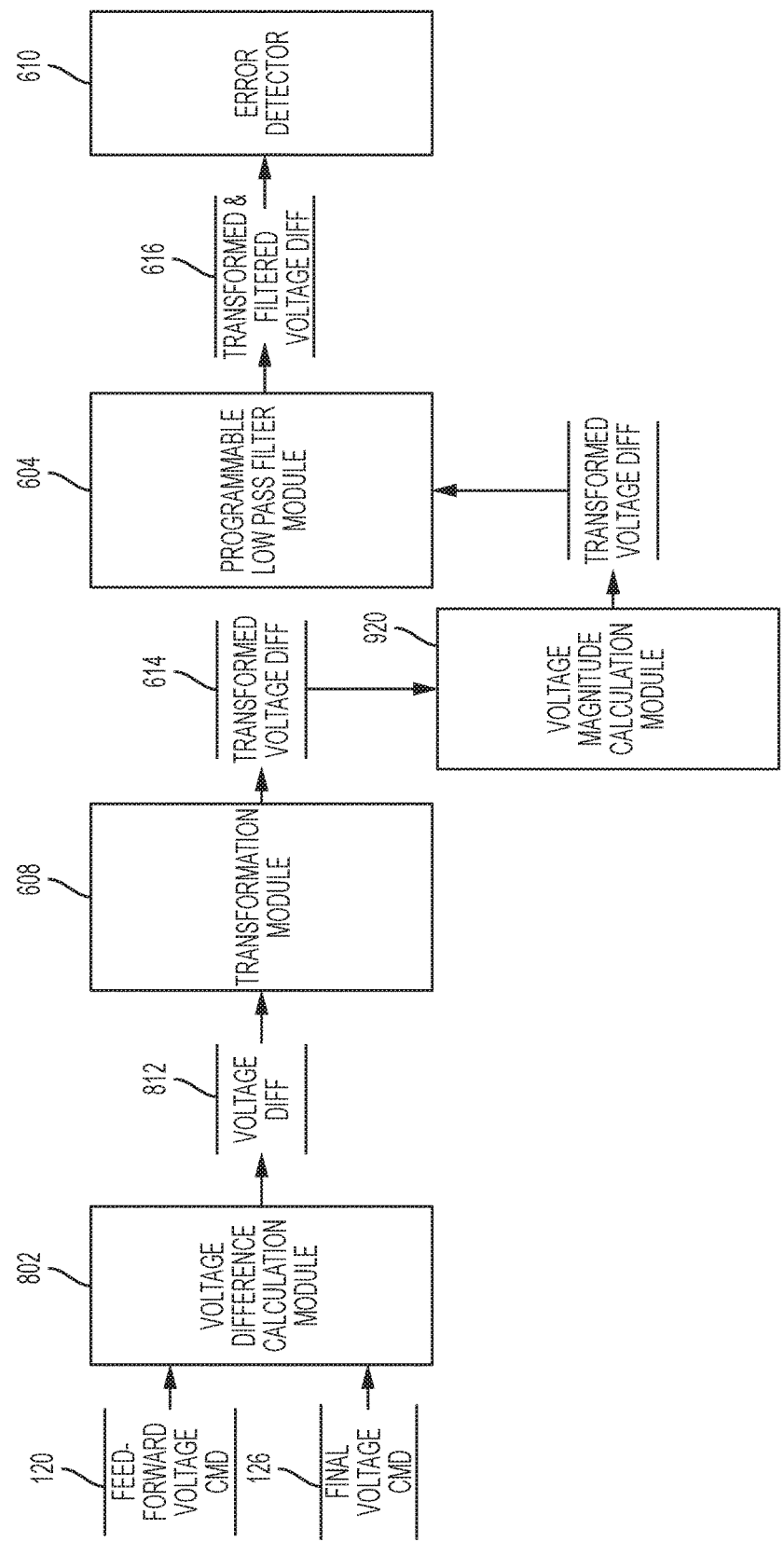
FIG. 9 illustrates a schematic diagram of a phase current measurement diagnostic module in accordance with another embodiment.

FIG. 9 illustrates yet another embodiment for implementing the current phase diagnostic module 106. For example, the current phase diagnostic module 106 includes the voltage difference calculation module 802, the transformation module 608, the low pass filter module 604, the error detection module 610, and a voltage magnitude calculation module 920. The voltage magnitude calculation module 920 calculates the magnitude of the stationary frame voltage vector before performing the adaptive low-pass filtering.

The voltage magnitude block computes the magnitude of the stationary frame voltage vector $|\Delta V_{\alpha\beta}|$. This computation may be expressed as, $$|\Delta V_{\alpha\beta}|^2 = \Delta V_\alpha^2 + \Delta V_\beta^2$$
$$= (-\Delta I_0 R \cos\phi - \Delta I_0 \omega_e \Delta L \sin(2\theta - \phi))^2 + (-\Delta I_0 R \sin\phi - \Delta I_0 \omega_e \Delta L \cos(2\theta - \phi))^2$$
$$= \Delta I_0^2 (R^2 + \omega_e^2 \Delta L^2) + 2\Delta I_0 R \omega_e \Delta L \sin 2\theta$$
$$|\Delta V_{\alpha\beta}| = \sqrt{\Delta I_0^2 (R^2 + \omega_e^2 \Delta L^2) + 2\Delta I_0 R \omega_e \Delta L \sin 2\theta}\ .$$

In addition, parameter errors may be introduced as additional pulsating terms at synchronous frequency, which are filtered out by the low-pass filter. The minimum frequency of the low-pass filters used by the low pass filter module 604 is limited based on the minimum detection time required. The detection time for this implementation may be expressed as, $$t_d = \frac{-1}{\left|k\frac{N_p}{2}\omega_m\right|_{lim}} \log_e\left(1 - \frac{\Delta I_{th}}{\Delta I_e}\right) + \frac{n_{th}}{n_p}T_s$$

where $\Delta I_{th}$ is the current offset error detection threshold (equal to $\frac{2}{3}\Delta I_x$ and $$\frac{2}{\sqrt{3}}\Delta I_x$$

for three and two measurement systems respectively) and $\Delta I_e$ is the actual offset error in the system.

Figure 10:
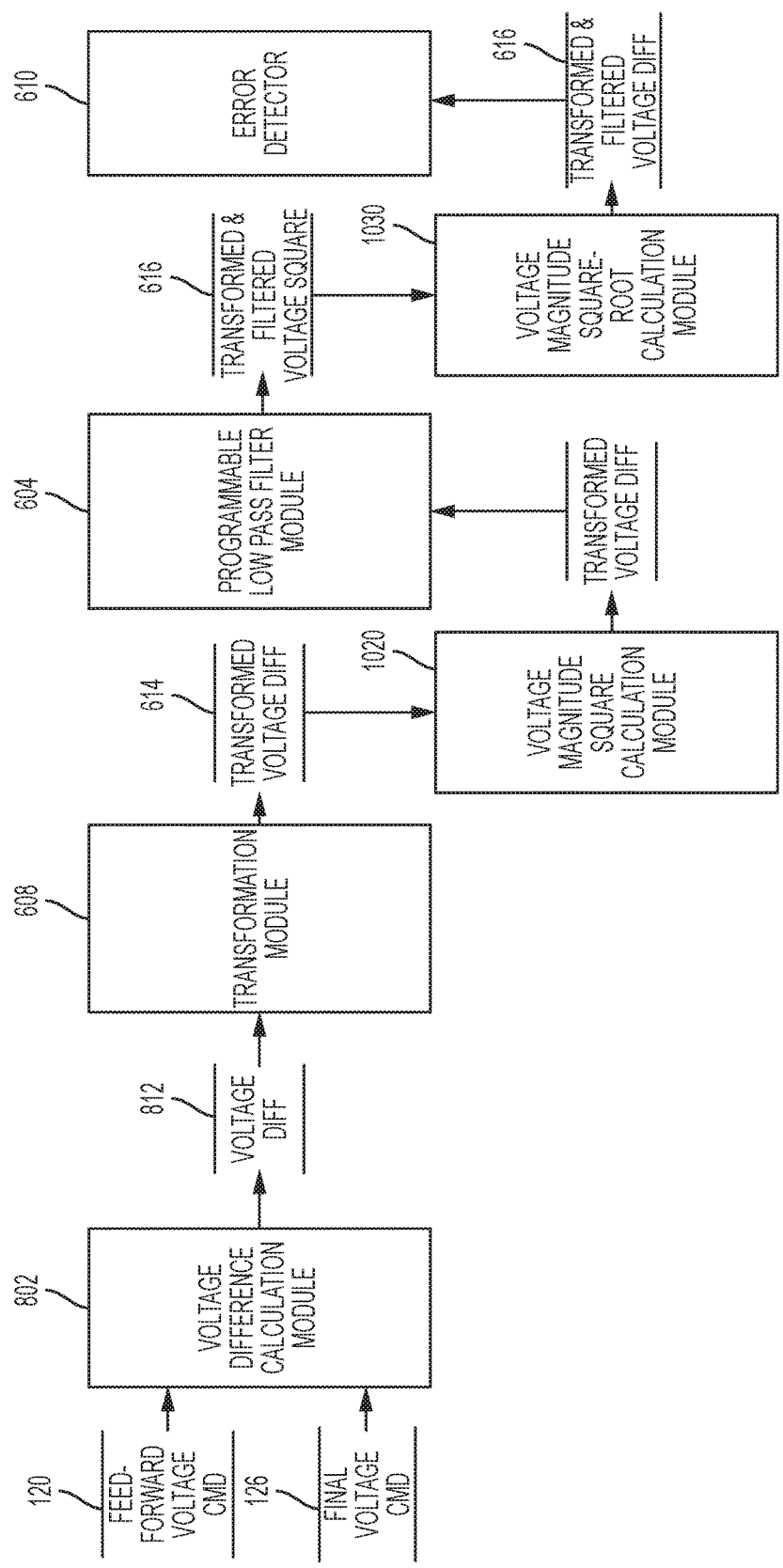
FIG. 10 illustrates a schematic diagram of a phase current measurement diagnostic module in accordance with another embodiment.

In yet another embodiment, the phase current diagnostic module 106 may be implemented by performing the magnitude square calculation first, then filtering and taking the square-root thereafter. FIG. 10 illustrates the components and dataflow of such an implementation.

Figure 11:
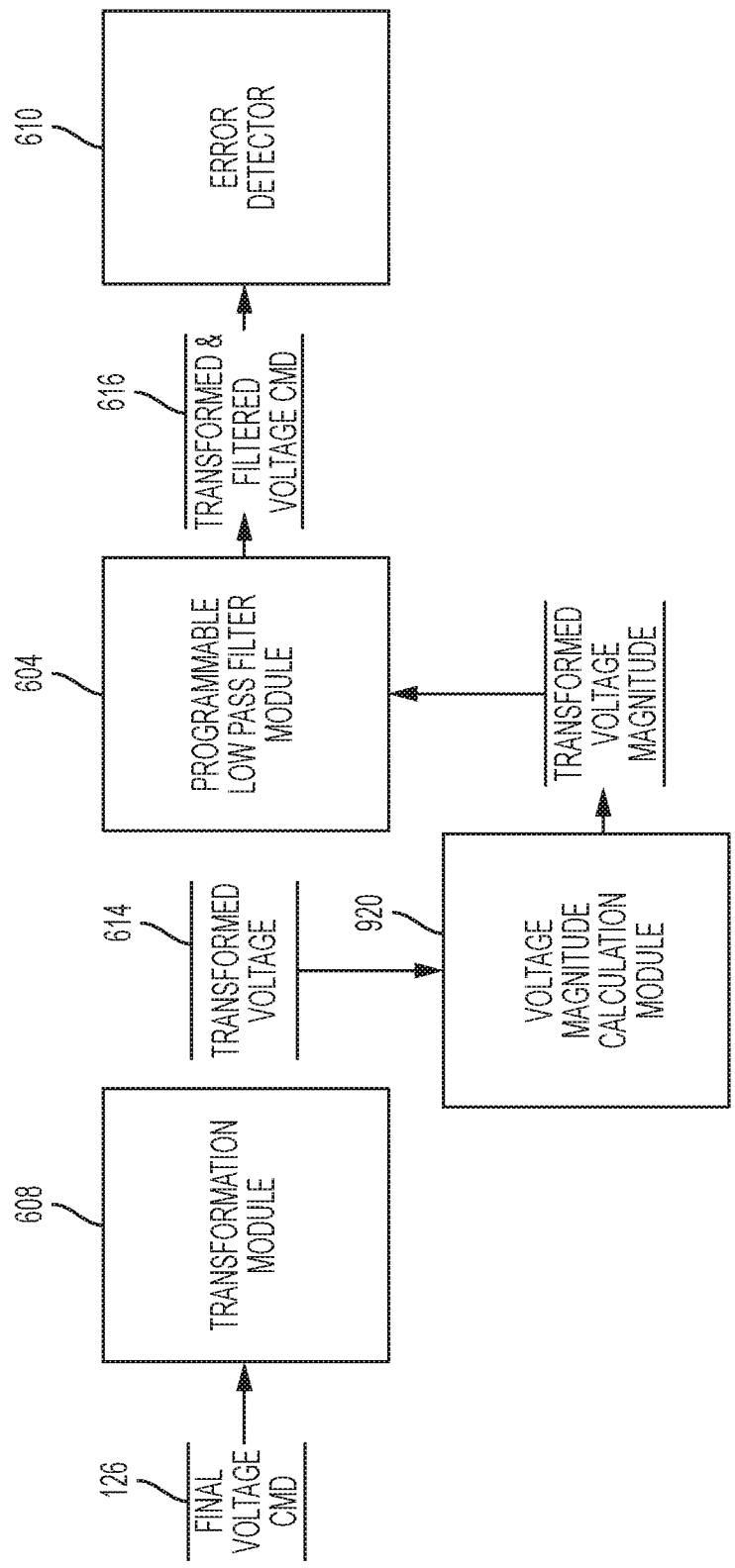
FIG. 11 illustrates a schematic diagram of a phase current measurement diagnostic module in accordance with another embodiment.
Figure 12:
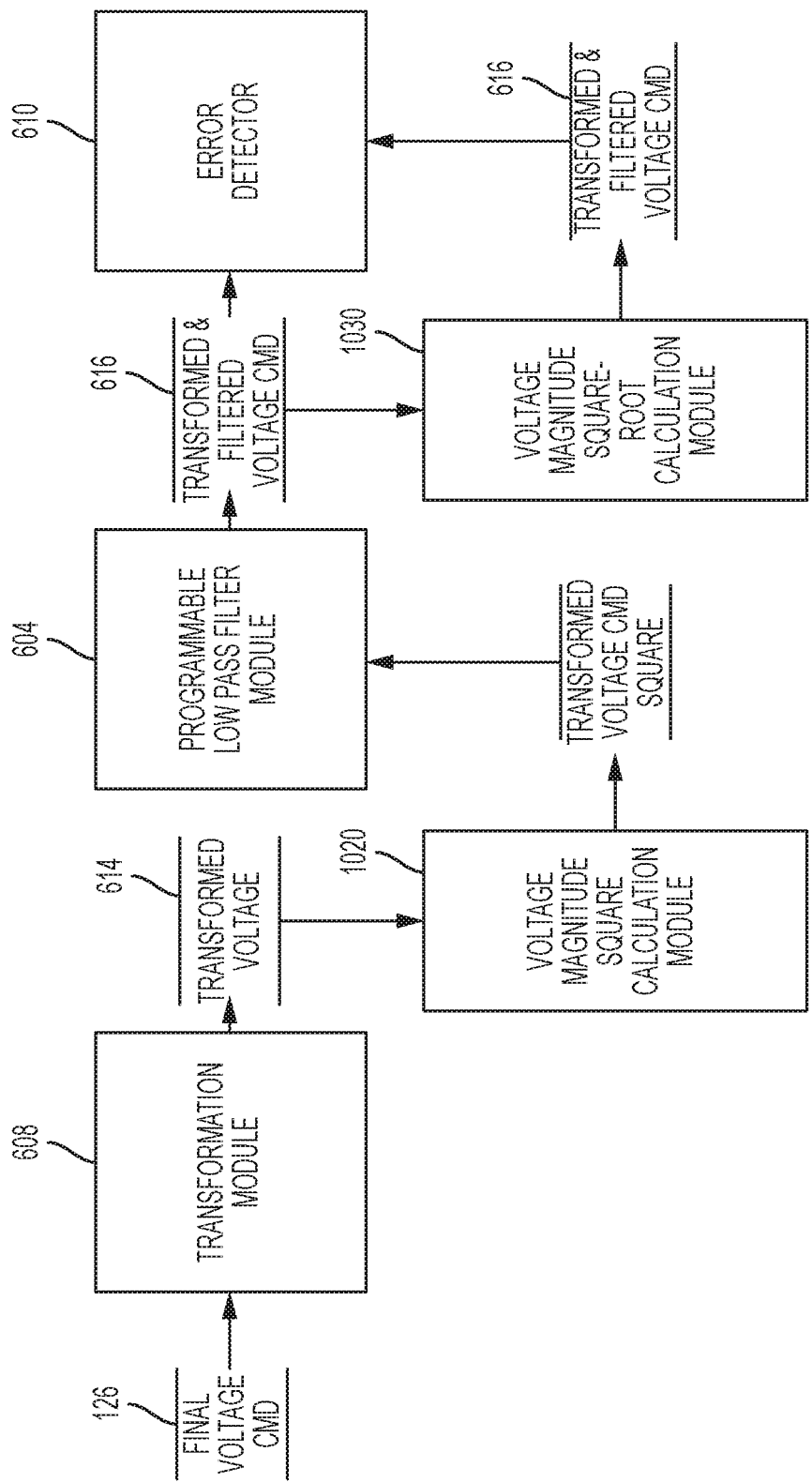
FIG. 12 illustrates a schematic diagram of a phase current measurement diagnostic module in accordance with another embodiment.

In one or more examples, the current phase diagnostic module 106 may use the magnitude calculation without the voltage difference calculation. For example, FIG. 11 and FIG. 12 illustrate the components and the dataflows for determining the current offset errors using magnitude calculation. For example, in FIG. 11 the voltage magnitude calculation module 920 computes the magnitude of the transformed voltage command 614, and passes the result for low pass filtering to the low pass filter module 604. The transformed and filtered voltage command magnitude output by the low pass filter module 604 is subsequently passed to the error detection module 610, which configures the diagnostic flag 130 according to the comparison with a predetermined threshold in the stator frame.

Alternatively, as illustrated in FIG. 12, the voltage magnitude square calculation module 1020 computes the a square of the magnitude of the transformed voltage command 614, and passes the output to the programmable low pass filter module 604. The square of the magnitude of the filtered voltage command is then passed to the voltage magnitude square root calculation module 1030 for determining the transformed and filtered voltage command 616. The result is then passed to the error detection module 610, which configures the diagnostic flag 130 according to the comparison with a predetermined threshold in the stator frame.

In yet another embodiment, effects of the speed of the motor changing the thresholds used for the offset diagnosis are reduced, by converting the output of the voltage magnitude square calculation module 1020 into a square of current value. For example, the following expression may be used for the conversion.

$$|\Delta I_{\alpha\beta}|^2 = \frac{|\Delta V_{\alpha\beta}|^2}{(\hat{R}^2 + \omega_e^2 \Delta \hat{L}^2)} \approx \Delta I_0^2 + \frac{2\Delta I_0 R \omega_e \Delta L}{(\hat{R}^2 + \omega_e^2 \Delta \hat{L}^2)}\sin 2\theta$$

The current magnitude square is then low-pass filtered by the low pass filter module 604 and compared to a current threshold by the error detection module 610.

The technical solutions described herein facilitate diagnosing the current offset errors associated with a closed-loop system controlling a motor, such as in an EPS application. For example, DC components in a synchronous frame are seen due to resistance estimation errors, which are pulsating components in the stationary frame. With the offset error, the stationary frame voltages have a large DC component, and the pulsating components are successfully removed by the adaptive low-pass filters. The speed change of the motor does not affect the error voltages, and accordingly, the technical solutions facilitate detecting the offset errors in the current using the low pass filters based on the motor frequency and reduce the detection time. Typically, the additional residual pulsating components in synchronous are due to the saliency terms for the salient pole machine. Using the technical solutions described herein the low-pass filter applied to the stationary frame voltage magnitude removes the pulsating components, and generates the DC component, which contains the current measurement offset error information.

According to one or more embodiments, a system for detecting current measurement offset error in a motor control system includes a transformation module that converts a final voltage command from a synchronous reference frame into a stator reference frame. The system further includes a programmable low pass filter module that filters the transformed final voltage command and generates a filtered final voltage command that includes a constant component corresponding to the current measurement offset error. The system further includes an error detection module that determines the current measurement offset error based on the filtered final voltage command in the stator reference frame.

According to one or more embodiments, a method for detecting current measurement offset error in a motor control system includes determining a voltage difference of a reference voltage command and a final voltage command in a rotor reference frame, the voltage difference includes a constant component and a sinusoidal component. The method further includes transforming the voltage difference from a rotor reference frame to a transformed voltage difference in a stator reference frame. The method further includes filtering the transformed voltage difference to generate a filtered voltage difference that includes the constant component. The method further includes determining a current measurement offset error based on the filtered voltage difference in the stator reference frame.

According to one or more embodiments, a system for detecting current measurement offset error in a motor control system includes a voltage difference calculation module that determines a voltage difference of a reference voltage command and a final voltage command in a rotor reference frame. The voltage difference includes a constant component and a sinusoidal component, of which the constant component is caused by parameter errors, and the sinusoidal component is caused by the current measurement offset errors. The system further includes a transformation module that transforms the voltage difference into a stator reference frame, and a programmable low pass filter module that filters the transformed voltage difference and generates a filtered voltage difference that includes the sinusoidal component. The system further includes an error detection module that determines the current measurement offset error based on the filtered voltage difference in the stator reference frame.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description.

What is claimed is:

1. A system for detecting current measurement offset error in a motor control system comprising:
   a control module that generates a final voltage command for a motor in response to an operator command;
   a transformation module that converts the final voltage command from a synchronous reference frame into a stator reference frame, the transformation module transforms the final voltage command using an inverse park transform to transform the final voltage command to the stator reference frame;
   a programmable low pass filter module that filters the transformed final voltage command and generate a filtered final voltage command that includes a constant component corresponding to the current measurement offset error; and
   an error detection module that determines the current measurement offset error based on the filtered final voltage command in the stator reference frame, the final voltage command causes the motor to generate a corresponding amount of torque.

2. The system of claim 1, the programmable low pass filter module including a transfer function based on a synchronous motor frequency and a calibratable constant.

3. The system of claim 1, wherein the transformation module transforms a sinusoidal component corresponding to the current measurement offset error in the final voltage command into the constant component.

4. The system of claim 1, wherein the programmable low pass filter module uses a first order filtering that utilizes a transfer function of $$L(s) = \frac{k\tilde{\omega}_e}{s + k\tilde{\omega}_e},$$

where k is a constant value and $\omega_e$ is a synchronous frequency of a motor associated with the motor control.

5. The system of claim 1, wherein the low pass filter module performs the low pass filtering in a discrete domain.

6. The system of claim 5, wherein the discrete domain used is according to:

$$s = \frac{2}{T_s} \frac{1 - z^{-1}}{1 + z^{-1}},$$

where $T_s$ is a sampling time.

7. The system of claim 1, the current measurement offset error is further determined based on the final voltage command in a rotor reference frame.

8. A method for detecting current measurement offset error in a motor control system comprising:

receiving an input command to generate a torque using a motor controlled by the motor control system;

determining a voltage difference of a reference voltage command and a final voltage command in a rotor reference frame, the voltage difference includes a constant component and a sinusoidal component;

transforming the voltage difference from a rotor reference frame to a transformed voltage difference in a stator reference frame using an inverse park transform;

filtering the transformed voltage difference to generate a filtered voltage difference that includes the constant component; and determining a current measurement offset error based on the filtered voltage difference in the stator reference frame, the final voltage command causing the motor to generate the torque.

9. The method of claim 8, wherein the filtering is based on a transfer function that is based on a synchronous motor frequency of a motor of the motor control and a calibratable constant.

10. The method of claim 8, wherein the transformation of the voltage difference from the rotor reference frame to the stator reference frame transforms the sinusoidal component corresponding to the current measurement offset error in the final voltage command into a constant component in the transformed voltage difference.

11. The method of claim 8, wherein the filtering includes first order low pass filtering using a transfer function of:

$$L(s) = \frac{k\tilde{\omega}_e}{s + k\tilde{\omega}_e},$$

where k is a constant value and $\omega_e$ is a synchronous frequency of a motor of the motor control.

12. The method of claim 8, wherein the filtering is low pass filtering performed in a discrete domain.

13. The method of claim 8, wherein the transformed voltage offset is based on the difference of a feedforward voltage command and the final voltage command in a rotor reference frame, and the current measurement offset is determined at least in part on the transformed voltage offset.

14. The method of claim 13, wherein an error flag signal is generated based on a magnitude of the current measurement offset error.

15. A system for detecting current measurement offset error in a motor control system comprising:

a voltage difference calculation module that determines a voltage difference of a reference voltage command and a final voltage command in a rotor reference frame, the voltage difference includes a first constant component and a first sinusoidal component, the final voltage command generated in response to an input command for generating torque using a motor controlled by the motor control system;

a transformation module that transforms the voltage difference into a stator reference frame, the transformed voltage difference including a second constant component and a second sinusoidal component, the transformation module transforms the voltage difference using an inverse park transform;

a programmable low pass filter module that filters the transformed voltage difference and generate a filtered voltage difference that includes the second constant component; and an error detection module that determines the current measurement offset error based on the filtered voltage difference in the stator reference frame.

16. The system of claim 15, wherein the programmable low pass filter module includes a transfer function based on a synchronous motor frequency and a calibratable constant.

17. The system of claim 15, wherein the transformation module transforms the first sinusoidal component corresponding to the current measurement offset error in the final voltage command into the second constant component in the transformed voltage difference.

18. The system of claim 15, wherein the transformed voltage offset is based on the difference of a feedforward voltage command and the final voltage command in a rotor reference frame, and the current measurement offset is determined at least in part on the transformed voltage offset.

19. The system of claim 18, wherein an error flag signal is generated based on a magnitude of the current measurement offset error.

* * * * *